United States Patent [19]

Hawkins et al.

[11] Patent Number: 5,081,473
[45] Date of Patent: Jan. 14, 1992

[54] TEMPERATURE CONTROL TRANSDUCER AND MOS DRIVER FOR THERMAL INK JET PRINTING CHIPS

[75] Inventors: William G. Hawkins, Webster; Cathie J. Burke, Rochester, both of N.Y.

[73] Assignee: Xerox Corporation, Stamford, Conn.

[21] Appl. No.: 558,092

[22] Filed: Jul. 26, 1990

[51] Int. Cl.$^5$ ............................................. B41J 2/05
[52] U.S. Cl. .................. 346/140 R; 338/320; 357/59
[58] Field of Search ............... 346/140; 357/51, 59 F, 357/59 G, 59 R; 437/918; 338/314, 320

[56] References Cited

U.S. PATENT DOCUMENTS

| | | | |
|---|---|---|---|
| 4,429,321 | 1/1984 | Matsumoto | 346/140 |
| 4,472,875 | 9/1984 | Christian et al. | |
| 4,532,530 | 7/1985 | Hawkins | 346/140 |
| 4,539,571 | 9/1985 | Suzuki | 346/76 PH |
| 4,620,212 | 10/1986 | Ogasawara | 357/51 |
| 4,623,903 | 11/1986 | Hashimoto | |
| 4,719,477 | 1/1988 | Hess | 346/140 |
| 4,769,527 | 9/1988 | Hart et al. | |
| 4,947,192 | 8/1990 | Hawkins | 346/140 |

*Primary Examiner*—Joseph W. Hartary
*Attorney, Agent, or Firm*—Oliff & Berridge

[57] ABSTRACT

A transducer for a thermal ink jet printhead has a primary heating region having a tantalum layer, a silicon nitride layer and a polysilicon resistor layer. An n$^-$ drift layer resistor serves as a secondary heating region and a field layer of silicon dioxide acts as an insulator. The field layer is sandwiched between the primary heating region and the secondary heating region. The secondary heating region by heating the field layer causes the heat generated in the primary heating region to be directed toward ink which lies above the primary heating region. An electrical contact connects the polysilicon resistor layer of the primary heating region to a driving transistor located on the same silicon wafer as the transducer. The driving transistor has a field oxide layer sandwiched between an n$^-$ drift layer and a field plate layer, the field plate layer causing secondary pinch off of the n$^-$ drift layer thus enabling higher operating voltages.

20 Claims, 1 Drawing Sheet

TEMPERATURE CONTROL TRANSDUCER AND MOS DRIVER FOR THERMAL INK JET PRINTING CHIPS

BACKGROUND OF THE INVENTION

1. Field of the Invention

The present invention pertains to thermal ink jet printheads and more particularly to the thermal ink jet chip architecture for transducers and transistors formed on the surface of the thermal ink jet chip. More specifically, the present invention relates to a thermal ink jet (TIJ) resistor element which is formed on top of a silicon dioxide field oxide layer and a secondary printhead heating resistor which is formed from an n− diffusion in the silicon substrate under the field oxide. By placing the secondary diffused resistor in the substrate and under the TIJ resistor elements, a compact thermal ink jet chip can be designed and the n- resistor elements are able to rapidly heat the printhead drop ejection region. Close temperature control of the drop ejection region enables uniform ink droplet volume to be ejected.

2. Description of the Related Art

Thermal ink jet marking technology has resulted in low cost monochrome and process color printing. Because the size of the ejected ink droplet (and resultant printed pixel) is sensitive to the transducer temperature, it is important to achieve good temperature control. Temperature control is most easily achieved by selecting an operating point above ambient, typically around 35°–45° C. Problems which are encountered with elevated operating temperature include degasing of ink due to decreased gas solubility which can lead to air bubble generation; extended warm-up time before the first print can be made; and possible reliability problems resulting from the transducer being exposed to elevated temperatures for an extended length of time.

U.S. Pat. No. 4,539,571 to Suzuki discloses a thermal printing system wherein an auxiliary resistor is shown which keeps a printhead warm. U.S. Pat. No. 4,429,321 to Matsumoto discloses a liquid jet recording head wherein an electrothermal transducer and its driver are formed upon a single substrate. U.S. Pat. No. 4,769,527 to Hart et al discloses a thermal image generating device wherein a pair of resistors are used to create a more uniform image.

U.S. Pat. No. 4,623,903 to Hashimoto discloses a thermal printhead having two resistors, a main heater resistor and an auxiliary resistor for maintaining constant temperature of the thermal head. U.S. Pat. No. 4,472,875 to Christian et al discloses a method for manufacturing an integrated circuit device by forming a transducer and a driver circuit for a thermal printhead on a single substrate. U.S. Pat. No. 4,719,477 to Hess discloses an integrated thermal ink jet printhead and method of manufacture which utilizes an on-chip MOS-FET driver.

As further background, U.S. Pat. Nos. 4,774,530 (Ink Jet Printhead) and 4,532,530 (Bubble Jet Printing Device) to Hawkins are hereby incorporated by reference for their disclosures of the structure and operation of thermal ink jet printheads.

However, a need still exists for a thermal ink jet printing chip which incorporates an architectural design which could be easily incorporated into typical chip fabricating processes and which would allow rapid heating of the transducer element and high voltage operation of the driver elements with the driver and transducer both being located upon the same chip.

SUMMARY OF THE INVENTION

Therefore, it is an object of the present invention to provide a heating element under the field layer of an ink jet transducer which results in reduced warm-up time for a thermal printhead.

Another object of the present invention is to reduce warm-up time of the transducer element by utilizing architecture which has a minimal impact on present fabricating methods or on chip area.

Yet another object of the present invention is to provide a MOS-type transistor which is connected to and lies upon the same chip as the transducer element and which is provided with an architecture which allows high voltage operation.

These and other objects and advantages are obtained by a resistive transducer for a thermal ink jet printhead according to the present invention having a primary heating region upon which ink is heated. A silicon dioxide field oxide layer lies below the primary heating region. Below the silicon dioxide field oxide layer is a secondary heating region. Thus, the field oxide layer is sandwiched between the primary and secondary heating regions. When current is applied to the primary and secondary heating regions, the heat from the secondary heating region heats the transducer field oxide layer above ambient while the primary heating region increases the temperature of the ink to form a steam bubble. Since heat naturally conducts from warm regions to colder regions, the heat from the primary heating region dissipates to the relatively cooler ink lying above the primary heating region.

The primary heating region comprises a doped silicon resistor layer having a dopant concentration of about $10^{20}$ ions/cm$^3$, a silicon nitride layer lies above the resistor layer, and a tantalum layer lies directly above the silicon nitride layer.

Connected to the resistor layer of the primary heater is aluminum wiring which connects the resistor layer to the drain of a MOS-type driver element which lies upon the same silicon chip as the resistive transducer. The driver element has an n− drift layer of silicon upon which a field oxide layer of silicon dioxide is positioned. A polysilicon field plate lies atop the field oxide layer and provides secondary pinchoff of the n− drift layer thus allowing higher voltage operation than would otherwise be possible.

An additional benefit is that the present invention will not impact chip costs as only mask changes from traditional fabrication techniques are required. Furthermore, since rapid transducer heating results in rapid warm-up prior to printing, higher operating frequencies of a thermal ink jet device can be realized.

BRIEF DESCRIPTION OF THE DRAWINGS

The invention will be described in detail with reference to the following drawings, wherein.

DETAILED DESCRIPTION OF THE PREFERRED EMBODIMENT

Figure 1:
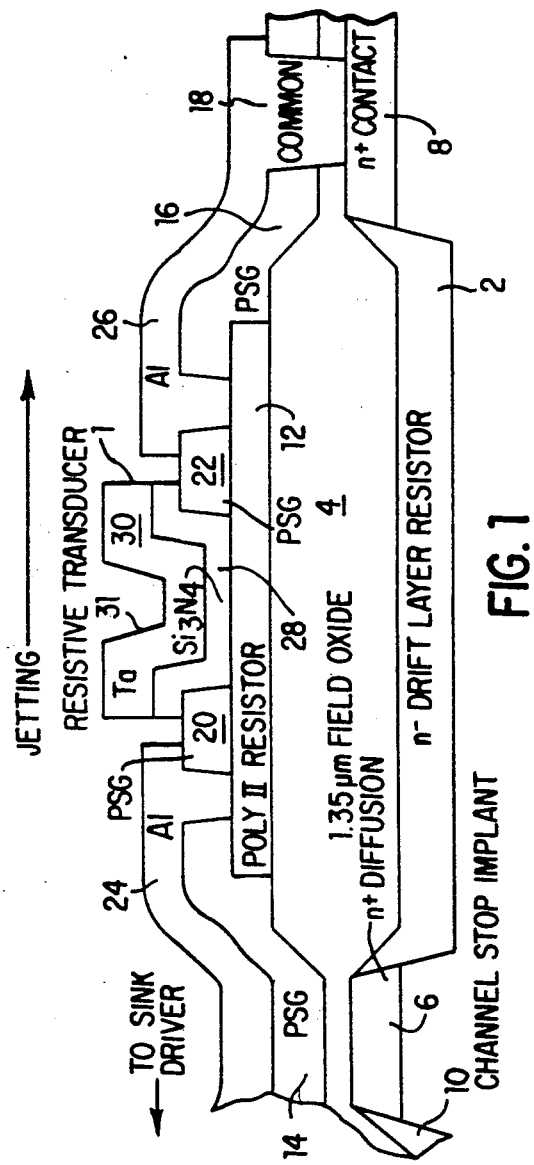
FIG. 1 is a side view of the transducer of the present invention.

Referring now to the drawings, wherein like reference numerals designate identical or corresponding parts throughout the several views, and more particularly to transducer 1 of FIG. 1 thereof, an ion-implanted $n^{31}$ drift layer of doped silicon 2 is seen buried under a field oxide layer 4 of silicon dioxide grown by a thermal oxidation process. The field layer 4 is preferably about 1.35 micrometers thick. The $n^-$ layer 2 has a dopant concentration of approximately $2 \times 10^{16}$ ions/cm$^3$. A doped polysilicon resistor layer 12, which is preferably about ½ micron in thickness, is formed by a chemical vapor deposition (CVD) process and lies atop the field layer 4. Thus, field oxide layer 4 is sandwiched between the resistor layer 12 and the $n^-$ layer 2 (i.e., between the primary and secondary heating regions). Resistor 12 has a dopant concentration of preferably about $10^{20}$ ions/cm$^3$. Preferably, the $n^-$ layer 2 is about 145 to 175 microns in length and is approximately ½ micron in thickness.

The $n^-$ drift layer 2 is bordered by an $n^+$ diffusion layer 6 and an $n^+$ contact layer 8. Layers 6 and 8 are formed of ion implanted arsenic doped silicon and have a dopant concentration of preferably about $10^{20}$ arsenic/cm$^3$. Layers 6 and 8 are preferably formed at the same time. The $n^+$ diffusion layer 6 abutts to a channel stop implant layer 10 of boron doped silicon having an ion concentration of preferably about $2 \times 10^{16}$/cm$^3$. An $n^-$ drift spacer can optionally be inserted between the $n^+$ contact regions (6,8) and the channel stop region (10) to prevent breakdown laterally across the contact-channel stop junction.

Atop resistor 12 is a silicon nitride layer 28 (preferably about 1500 angstroms thick) formed by a CVD process. The silicon nitride supports a tantalum layer 30 (also preferably about 5000 angstroms thick) formed by sputtering.

On the lateral sides of the lower portions of the silicon nitride layer 28 located above resistor 12 are phosphosilicate glass (PSG) regions 20 and 22 preferably formed of about 7½ weight percent phosphorous. As is apparent from FIG. 1, phosphosilicate glass layers 14 and 16 are identical to and are preferably formed at the same time as PSG layers 20 and 22 to form a contiguous PSG layer. The purpose of the PSG layer is to planarize the surface of the wafer prior to aluminum metallization. Alternative planarization schemes such as borophosphosilicate glass (BPSG) or combinations of spin on glass and deposited layers can also be used.

Vias are etched between regions 14 and 20 and between regions 22 and 16 to allow for aluminum contacts 24 and 26 to connect with resistor 12 for the supply and exit of power to and from the resistor 12. Aluminum layer 24 connects resistor 12 to a drain 38 (see FIG. 2) of a driver 60. Aluminum layer 26 connects resistor 12 to a common bus line 18 through which a plurality of resistive transducers, such as the transducer shown in FIG. 1, receive power. This plurality of resistive transducers (not shown) are parallel and in linear alignment upon the surface of a silicon wafer. The bus line 18 or "common" 18 preferably provides about 35 to 40 volts to the plurality of transducers along its length.

When the driver 60 is activated, current is conducted through the transducer 1 via the common 18 to the aluminum layer 26 and through the resistor 12 to the aluminum layer 24. The temperature of the resistor 12 increases resulting in ejection or jetting of an ink droplet.

The common 18 connects to the $n^+$ contact layer 8 which is connected to the $n^-$ drift layer 2 and $n^+$ diffusion layer 6. The $n^+$ diffusion layer 6 is electrically isolated from the aluminum connections 24, so the $n^-$ drift resistor 2 can be separately turned on and off to control temperature in the region of the resistive transducer 1. Drift resistor 2 is turned on by sinking $n^+$ diffusion layer 6 to ground. While the polysilicon resistor 12 has short current pulses applied (typically <10 microseconds) to effect ink droplet ejection followed by a quiescent state of 100 microseconds to several milliseconds, the drift layer resistor will be separately switched on and off with a longer duty cycle in order to control printhead temperature.

When the $n^+$ diffusion layer 6 is attached to ground, current flows from the common 18 through $n^+$ contact 8 and then through $n^-$ drift layer resistor 2 and is collected by $n^+$ diffusion layer 6. Current then flows along $n^+$ diffusion layer 6 perpendicular to the plane of FIG. 1. Diffusion layer 6 spans the length of the polysilicon resistor 12 array.

Figure 2:
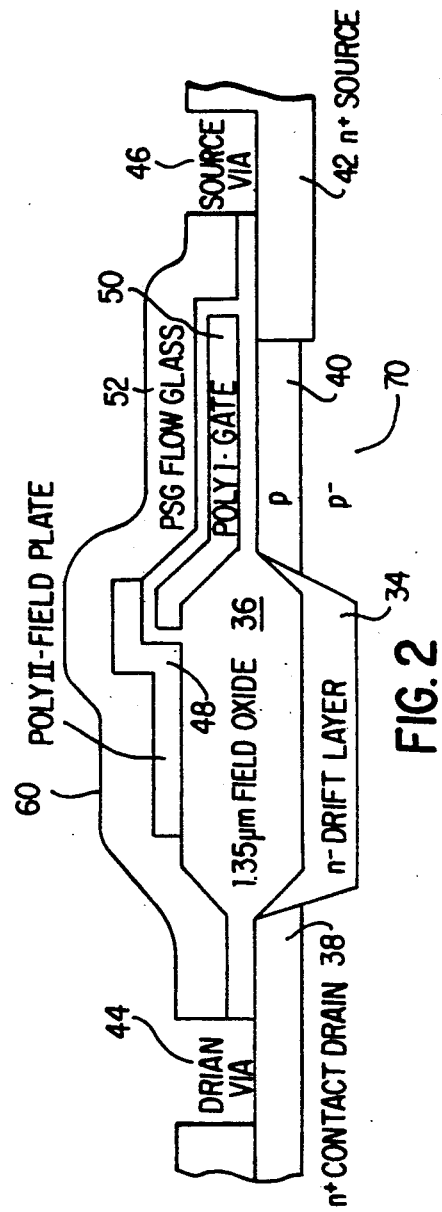
FIG. 2 is a side view of the driver of the present invention.

The current flow through the $n^-$ drift resistor 2 can be controlled either by connecting the $n^+$ diffusion layer 6 to aluminum metallization which terminates in a bonding pad for routing off chip, or by connecting the $n^+$ diffusion layer 6 to one or more power MOS drivers as shown in FIG. 2. When the $n^-$ drift resistor is activated by power MOS devices on the same chip, interconnection is made between the $n^+$ diffusion layer 6 and $n^+$ drain contact 38 by an aluminum lead, in a manner analogous to aluminum lead 24.

Power MOS logic gates formed upon the same chip as the driver and transducer may be provided as a means to control the drivers. One driver can be located at each end of the thermal ink jet resistor array to allow appropriate current switching in the $n^-$ drift resistors. Alternatively, a circuit board off of the chip could act as a mechanism for turning on and off the drivers for resistor 12 actuation and the $n^-$ drift resistors.

With reference to FIG. 2, a driver 60 has an $n^-$ silicon layer 34, approximately 500 nm in thickness, and doped with a concentration of preferably about $2 \times 10^{\neq}$ ions/cm$^3$. Layer 34 lies atop $p^-$ silicon wafer 70 upon which transducer 1 is formed as well. Above the silicon dioxide layer 36 is a polysilicon field plate layer 48 of heavily doped silicon having a dopant concentration of preferably about $10^{20}$ ions/cm$^3$. The thickness of field plate layer 48 is approximately 450 nm. Silicon dioxide layer 36 is located between field plate layer 48 and $n^-$ silicon layer 34. Silicon dioxide layer 36 is located above the $n^-$ silicon layer 34 and is about 1.35 micrometers in thickness and is grown by a thermal oxidation process.

In an alternative embodiment of FIG. 2, layer 48 and layer 50 can be combined into a single structure which serves as both a field plate 48 and a gate 50. By merging layer 48 and layer 50, a single polysilicon layer can be used to create both structures in a single deposition and etch sequence.

The geometric arrangement of layers 34, 36 and 48 allow the NMOS transistor of FIG. 2 to operate at high voltages without breakdown as the presence of field plate 48 causes secondary pinchoff of the $n^-$ drift layer 34. What is meant by secondary pinchoff is that the electric field lines pass between the drain 38 and edge of field plate 48, thereby spreading the electric field across the $n^-$ layer 34 and preventing the electric field from reaching a level which would induce avalanche breakdown adjacent to the drain 42 thus causing breakdown of transistor 60. Since these field lines are spread apart by the presence of field plate 48, higher operating voltages are made possible. Tests have verified that field plate 48 does indeed cause secondary pinchoff of n⁻ drift layer 34.

Drain via 44 is located to one side of field oxide layer 36 with n+ contact drain region 38 being located directly below the drain via 44. On the opposite side of the field oxide layer 36 is located source via 46 which is located directly above n+source region 42. Etching is used to form vias 44 and 46 with n+contact drain 38 and n+ source 42 being formed of ion implanted n type doped silicon having a dopant concentration of preferably about $10^{20}/cm^3$.

A p type channel region 40, of boron doped silicon preferably having a dopant concentration of about $10^{16}/cm^3$ near the surface to control MOS transistor threshold or turn on voltage and a dopant concentration of less than $5 \times 10^{15}/cm^3$ in the bulk substrate to increase junction breakdown at the drain is located below a polysilicon gate region 50. Gate region 50 is a region of phosphorous doped silicon having a dopant concentration of preferably about $10^{20}$ ions/cm³. Gate region 50 is surrounded by a portion of field oxide layer 36 with a section of gate region 50 lying below an extreme end portion of field plate layer 48. Another section of polysilicon gate layer 50 lies directly above (but does not make contact with) an end portion of n+ source region 42. Gate region 50 extends the entire length above p type silicon layer 40 but does not contact layer 40. Gate region 50 is preferably greater than 2 micrometers wide. The doping concentration of gate layer 50 provides it with metallic properties. Phosphosilicate glass region 52 covers the NMOS driver 60 and extends from the drain via 44 to the source via 46.

It is apparent to those skilled in the art that the layers of the transducer and the driver which are formed of identical materials are preferably formed at the same time during the fabrication process.

The n⁻ drift layer resistor 2 has a typical sheet resistance of about 5K ohms/square. In the case of a 128 jet device, the resistance of the n⁻ drift resistor 2 can be ≧100 ohms (the resistor length and width is 200 micrometers by 10,800 micrometers). The drift layer resistor 2 must be capable of dissipating the same energy as the resistor elements 12 when they are operated at full black printing. Again, using the 128 jet case and 3 microsecond heating pulses with 200 microseconds between pulses (5 kHz jet drop ejection frequency), an 80 ohm n⁻ drift resistor 2 at 100% duty cycle is capable of providing the same heating as all resistor elements 12 at 100% duty cycle. In practice, substantial heat energy is carried away by the ink during high density printing, with the consequence that the n⁻ drift resistor needs to generate a fraction of the energy generated by the resistors 12 at 100% drop ejection duty cycle.

The foregoing description of the preferred embodiment is intended to be illustrative and not limiting. Modifications and variations can be achieved by those skilled in the art as a result of the above teachings. It is therefore to be understood that the invention may be practiced otherwise than as specifically described herein and still be within the scope of the appended claims.

What is claimed is:

1. A transducer device for converting electrical energy to thermal energy and for directing the thermal energy to an object to be heated, comprising:
   a transducer field oxide layer;
   a primary heating region located on one side of the transducer field oxide layer for dissipating thermal energy toward the object; and
   a secondary heating region located on an opposite side of the transducer field oxide layer from the primary heating region, the secondary heating region dissipating thermal energy to the transducer field oxide layer to enable close temperature control of the primary heating region and the object.

2. A device according to claim 1, further comprising:
   means for selectively applying an electrical current to said primary heating region and said secondary heating region.

3. A device according to claim 1, wherein:
   said primary heating region comprises a polysilicon resistor layer contacting said field oxide layer, a silicon nitride layer contacting said polysilicon resistor layer, and a tantalum layer contacting said silicon nitride layer and the object to be heated.

4. A device according to claim 1, wherein:
   said secondary heating region is an n⁻ drift layer.

5. A device according to claim 3, wherein:
   said secondary heating region is an n⁻ drift layer of phosphorous doped silicon having a dopant concentration of about $2 \times 10^{16}$ ions/cm³.

6. A device according to claim 2, wherein said means for applying comprises a common bus line connected to both said primary and secondary heating regions.

7. A device according to claim 5, wherein said n⁻ drift layer of phosphorous doped silicon is formed in a silicon wafer.

8. A device according to claim 7, further comprising a driver transistor device constructed in said silicon wafer and wherein the drain of the driver device is in electrical contact with said polysilicon resistor layer of said transducer device.

9. A device according to claim 1, wherein the object is ink.

10. A device according to claim 9, wherein the transducer is operatively associated with an ink flow channel thereby producing a thermal ink jet transducer.

11. A driver device according to claim 10, further comprising:
    a driver field layer; and
    an n⁻ drift layer on one side of said field oxide layer, and a field plate layer, on an opposite side of said driver field oxide layer, for causing secondary pinch off of the n⁻ drift layer.

12. A driver device according to claim 10, wherein said field plate layer is a layer of polysilicon.

13. A driver device for a transducer comprising:
    a field oxide layer;
    an n⁻ drift layer on one side of said field oxide layer; and
    means for causing secondary pinch off of said n⁻ drift layer, said means for causing being connected to an opposite side of said field oxide layer.

14. A device according to claim 13, wherein:
    said n⁻ drift layer is a layer of phosphorous doped silicon.

15. A device according to claim 14, wherein said field oxide layer is a silicon dioxide layer.

16. A device according to claim 13, wherein said causing means comprises a layer of phosphorous doped polysilicon.

17. A device according to claim 13, further comprising:
    a gate layer surrounded by said field oxide layer.

18. A device according to claim 17, wherein:

said gate layer is phosphorous doped silicon.

19. A device according to claim 18, wherein said gate layer of phosphorous doped silicon has a dopant concentration of $10^{20}$ ions/cm$^3$.

20. A device according to claim 13, wherein said causing means comprises a layer of phosphorous doped silicon having a dopant concentration of $10^{20}$ ions/cm$^3$.

* * * * *